(12) United States Patent
Kobayashi

(10) Patent No.: US 7,816,860 B2
(45) Date of Patent: Oct. 19, 2010

(54) LIGHT-EMITTING DEVICE, METHOD FOR MANUFACTURING THE SAME, AND ELECTRONIC APPARATUS

(75) Inventor: Hidekazu Kobayashi, Azumino (JP)

(73) Assignee: Seiko Epson Corporation, Tokyo (JP)

( * ) Notice: Subject to any disclaimer, the term of this patent is extended or adjusted under 35 U.S.C. 154(b) by 360 days.

(21) Appl. No.: 12/019,197

(22) Filed: Jan. 24, 2008

(65) Prior Publication Data

US 2008/0218071 A1    Sep. 11, 2008

(30) Foreign Application Priority Data

Mar. 8, 2007    (JP) .............................. 2007-058187

(51) Int. Cl.
*H05B 33/00* (2006.01)
*H01J 9/22* (2006.01)

(52) U.S. Cl. ...................... 313/504; 313/112; 313/113; 445/24

(58) Field of Classification Search ....................... None
See application file for complete search history.

(56) References Cited

U.S. PATENT DOCUMENTS

| | | | |
|---|---|---|---|
| 6,987,355 B2* | 1/2006 | Cok | 313/506 |
| 7,030,553 B2 | 4/2006 | Winters et al. | |
| 2005/0218768 A1* | 10/2005 | Saito | 313/112 |
| 2006/0108592 A1* | 5/2006 | Nishimura et al. | 257/89 |
| 2007/0205423 A1* | 9/2007 | Yamazaki et al. | 257/89 |
| 2008/0111459 A1* | 5/2008 | Helber et al. | 313/112 |

FOREIGN PATENT DOCUMENTS

| | | |
|---|---|---|
| JP | A-2000-100560 | 4/2000 |
| JP | A 2001-057290 | 2/2001 |
| JP | A-2003-123987 | 4/2003 |
| JP | A-2006-47592 | 2/2006 |
| JP | A-2006-127987 | 5/2006 |
| JP | A-2007-11063 | 1/2007 |
| JP | A-2007-503093 | 2/2007 |
| WO | WO 2005/101807 A2 | 10/2005 |
| WO | WO 2006/116346 A2 | 11/2006 |

\* cited by examiner

*Primary Examiner*—Ashok Patel
(74) *Attorney, Agent, or Firm*—Oliff & Berridge, PLC

(57) ABSTRACT

A light-emitting device includes a plurality of pixels constituting a screen, each of the pixels including four subpixels, which are a red subpixel, a green subpixel, a blue subpixel, and a remaining subpixel. The red subpixel has a light-emitting layer made of a white-light-emitting material and extending along the screen, and a color filter provided above the light-emitting layer to transmit red light, the white-light-emitting material emitting two-peak white light having an emission spectrum including a valley between a red peak residing in a wavelength range of red light and a blue peak residing in a wavelength range of blue light. The blue subpixel has a light-emitting layer made of the white-light-emitting material and extending along the screen, and a color filter provided above the light-emitting layer to transmit blue light. The remaining subpixel has a light-emitting layer made of the white-light-emitting material and extending along the screen. The green subpixel has a light-emitting layer made of a green-light-emitting material that emits green light and extending along the screen, and a color filter provided above the light-emitting layer to transmit green light.

11 Claims, 11 Drawing Sheets

FIG. 4

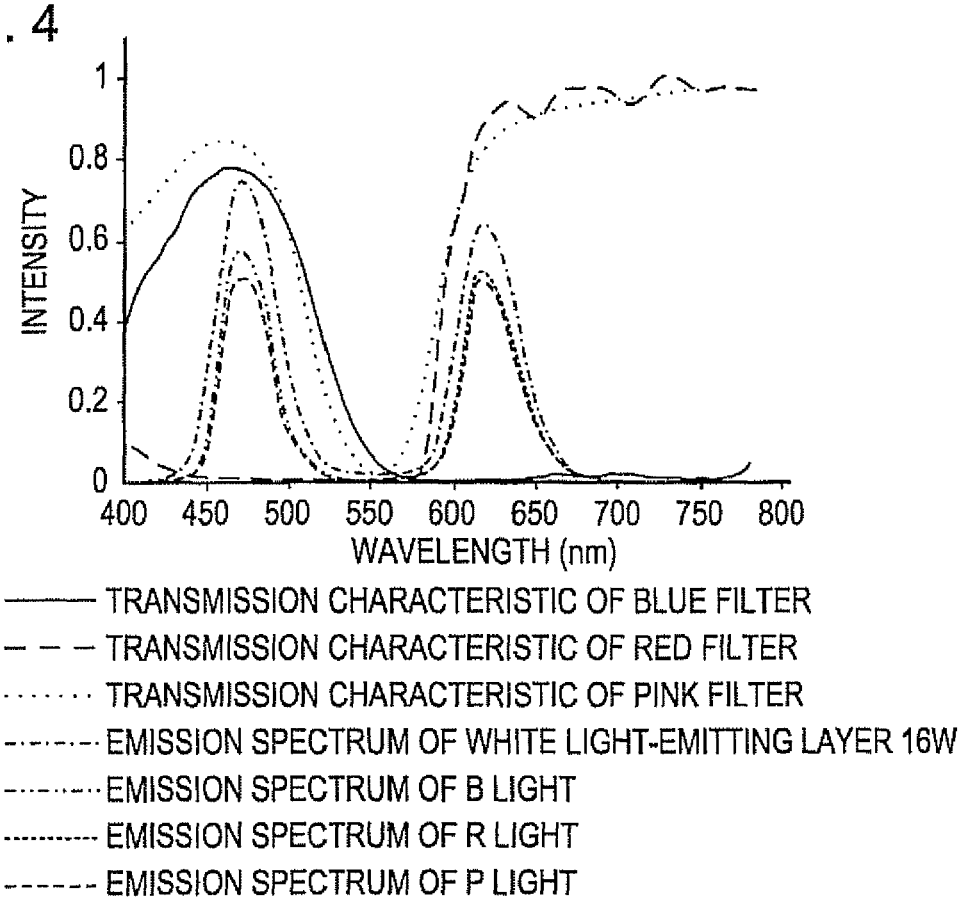

——— TRANSMISSION CHARACTERISTIC OF BLUE FILTER
— — — TRANSMISSION CHARACTERISTIC OF RED FILTER
······· TRANSMISSION CHARACTERISTIC OF PINK FILTER
—·—·— EMISSION SPECTRUM OF WHITE LIGHT-EMITTING LAYER 16W
—··—··— EMISSION SPECTRUM OF B LIGHT
············ EMISSION SPECTRUM OF R LIGHT
—————— EMISSION SPECTRUM OF P LIGHT

FIG. 5

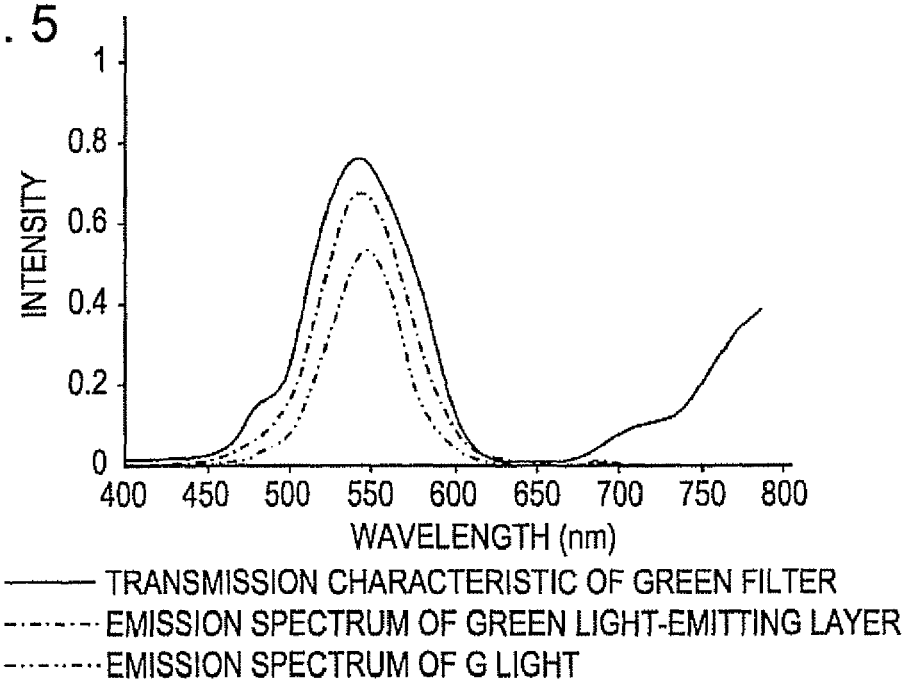

——— TRANSMISSION CHARACTERISTIC OF GREEN FILTER
—·—·— EMISSION SPECTRUM OF GREEN LIGHT-EMITTING LAYER
—··—··— EMISSION SPECTRUM OF G LIGHT

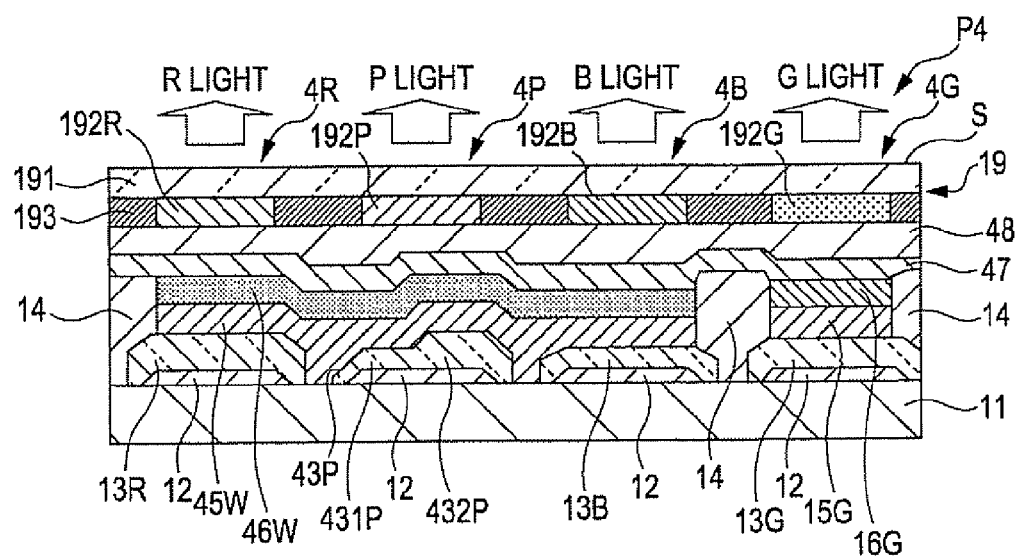
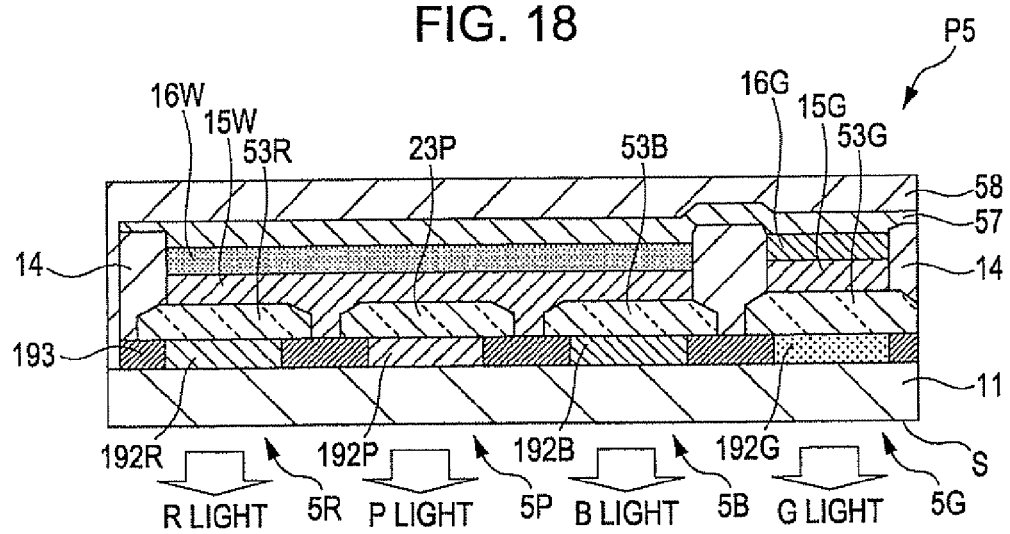

LIGHT-EMITTING DEVICE, METHOD FOR MANUFACTURING THE SAME, AND ELECTRONIC APPARATUS

BACKGROUND

1. Technical Field

The present invention relates to a light-emitting device, a method for manufacturing the same, and an electronic apparatus.

2. Related Art

There have been light-emitting devices (full-color display devices) for displaying a color image on a screen. Such light-emitting devices include a plurality of pixels that constitute a screen. Each of the pixels includes a plurality of subpixels, and each of the subpixels includes an electroluminescent (EL) element, such as an organic EL element or an inorganic EL element. Examples of such light-emitting devices include RGB light-emitting devices in which each of the pixels includes red, green, and blue subpixels, and RGBW light-emitting devices in which each of the pixels includes red, green, blue, and white subpixels.

Examples of the RGB light-emitting devices include: a first device, in which a light-emitting layer of each of the subpixels is made of an EL material that emit colored light corresponding to the subpixel; a second device, as disclosed in JP-A-2001-57290, in which light-emitting layers of the subpixels are made of an EL material that emits white light, and each of the subpixels includes a color filter with the characteristic corresponding to the color of the subpixel; and a third device, in which light-emitting layers of the subpixels are made of an EL material that emits blue light, and each of the red and green subpixels includes a color-conversion layer with the characteristic corresponding to the color of the subpixel.

An example of the RGBW light-emitting device is a fourth device, in which light-emitting layers of the subpixels are made of an EL material that emits white light, and each of the red, green, and blue subpixels includes a color filter with the characteristic of the corresponding color. The fourth device has a white subpixel in addition to the configuration of the second device. In the fourth device, when a pixel displays white, light emitted from the light-emitting layer of the white subpixel of the pixel is used.

The first device, which requires the use of a polarizing plate for preventing reflection of external light, has low utilization efficiency of emitted light. The second device, which loses a significant portion of the emitted light because of the presence of the color filters, has low utilization efficiency of emitted light. The third device, which requires the use of the color filters to block entrance of unwanted light and loses a portion of the emitted light because of the presence of the color-conversion layers and the color filters, has low utilization efficiency of emitted light. Accordingly the first to third devices have low utilization efficiency of emitted light. In order to realize sufficiently high display quality, the first to third devices have to consume a large amount of power.

The fourth device has a sufficiently high utilization efficiency of emitted light, because, when a pixel displays white, light emitted from the white subpixel of the pixel is output unobstructed. However, when a pixel displays red, green, or blue, the utilization efficiency of emitted light in the fourth device is reduced to 30% or 10%, the same level as the second device, That is, the fourth device has a sufficiently high utilization efficiency of emitted light in the white subpixel but a low utilization efficiency of emitted light in the other subpixels. In order to realize sufficiently high display quality, the fourth device also has to consume a large amount of power.

Now, let us consider a fifth device, which is a modification of the fourth device. In the fifth device as an RGBW light-emitting device, a light-emitting layer of each of the subpixels is made of an EL material that emits colored light corresponding to the subpixel. The fifth device has a sufficiently high utilization efficiency of emitted light in each of the subpixels. However, four types of EL materials need to be used in manufacturing the fifth device. It is clear that the manufacturing process of the fifth device is extremely complex.

Then, let us consider a sixth device, which is an RGB light-emitting device obtained by removing the white subpixel from the fifth device. The sixth device also has a sufficiently high utilization efficiency of emitted light in each of the subpixels. Further, the sixth device only requires three types of EL materials to be used in the manufacturing process. Therefore, the process of manufacturing the sixth device is simplified, compared with the fifth device, but is not sufficiently simple.

SUMMARY

An advantage of some aspects of the invention is that it provides a light-emitting device that can be manufactured in a sufficiently simple manner and realize sufficiently high display quality with low power consumption, a method for manufacturing the light-emitting device, and an electronic apparatus.

According to a first aspect of the invention, a light-emitting device includes a plurality of pixels constituting a screen, each of the pixels including four subpixels, which are a red subpixel, a green subpixel, a blue subpixel, and a remaining subpixel. The red subpixel has a light-emitting layer made of a white-light-emitting material and extending along the screen, and a color filter provided above the light-emitting layer to transmit red light, the white-light-emitting material emitting two-peak white light having an emission spectrum including a valley between a red peak residing in a wavelength range of red light and a blue peak residing in a wavelength range of blue light. The blue subpixel has a light-emitting layer made of the white-light-emitting material and extending along the screen, and a color filter provided above the light-emitting layer to transmit blue light. The remaining subpixel has a light-emitting layer made of the white-light-emitting material and extending along the screen. The green subpixel has a light-emitting layer made of a green-light-emitting material that emits green light and extending along the screen, and a color filter provided above the light-emitting layer to transmit green light. Each of the subpixels includes a single light-emitting element (an EL element such as an organic EL element).

With the light-emitting device according to the first aspect of the invention, appropriate setting of a color to be displayed by the remaining subpixel leads to a sufficiently high utilization efficiency of light emitted in all the subpixels, thereby realizing sufficiently high display quality with low power consumption. In addition, because the light-emitting layers of the red subpixel, the blue subpixel, and the remaining subpixel are made of the same material, this light-emitting device only requires two types of materials in forming the light-emitting layers. Therefore, the process of manufacturing the light-emitting device is simplified sufficiently. Therefore, the light-emitting device can be manufactured in a sufficiently simple manner and realize sufficiently high display quality with low power consumption.

In the light-emitting device according to the first aspect of the invention, the remaining subpixel may serve as a pink subpixel that has a color filter provided above the corresponding light-emitting layer to transmit pink light. A color of pink can be produced by combining light having a wavelength range of red light and light having a wavelength range of blue light. Therefore, in this light-emitting device, use of a color filter that transmits both light having a wavelength range of red light (orange light, for example) and light having a wavelength range of blue light (sky-blue light, for example) as the color filter that transmits pink light can sufficiently increase the utilization efficiency of light emitted from the pink subpixel. Accordingly, in this light-emitting device, the utilization efficiency of emitted light can also be sufficiently increased when white is displayed by using the pink and green subpixels. In order to display white in a single pixel, the above-mentioned sixth device requires light emission of three subpixels (red, green, and blue subpixels), whereas the device according to the first aspect of the invention only requires light emission of two subpixels (pink and green subpixels). This means that the light-emitting device according to the first aspect of the invention has a higher utilization efficiency of emitted light when displaying white than in the sixth device.

In the light-emitting device according to the first aspect of the invention, the remaining subpixel may serve as a white subpixel that displays a white color. The light-emitting layer of the white subpixel emits white light. Therefore, in this light-emitting device, the white subpixel can be configured to output light from the light-emitting layer with no obstruction. This means that the light-emitting device according to the first aspect of the invention can have a much higher utilization efficiency of light emitted from the white subpixel.

The light-emitting device according to the first aspect of the invention may further include a planar element substrate and a light-absorbing layer that absorbs light and provided under the element substrate. It is preferable that the light-emitting layer of each of the four subpixels be provided on the element substrate. It is also preferable that the light-emitting layer of each of the red, green, and blue subpixels be disposed between the corresponding color filter and the element substrate. This structure provides a top-emission light-emitting device, in which light emitted from the light-emitting layers is output in a direction away from the element substrate. This structure provides an advantage in that, because of the presence of the light-absorbing layer, the contrast of images can be maintained when a transmissive element substrate is used.

The light-emitting device according to the first aspect of the invention may further include a planar element substrate. It is preferable that the light-emitting layer of each of the four subpixels be provided on the element substrate and be disposed between the corresponding color filter and the element substrate. It is also preferable that each of the four subpixels have a transmissive layer that transmits light and is disposed between the corresponding light-emitting layer and the element substrate, and a reflective layer that reflects light and is disposed between the transmissive layer and the element substrate. It is also preferable that the transmissive layers of the red subpixel, the blue subpixel, and the remaining subpixel have a same thickness that intensifies light having a wavelength corresponding to the red peak and light having a wavelength corresponding to the blue peak simultaneously because of interference. It is also preferable that the transmissive layer of the green subpixel have a thickness that intensifies light having a wavelength corresponding to a peak of the green light emitted from the light-emitting layer in the green subpixel because of interference.

This structure also provides a top-emission light-emitting device. In this light-emitting device, each of the subpixels has the reflective layer between the corresponding light-emitting layer and the element substrate. Further, the thickness of the transmissive layer provided in each of the red subpixel, the blue subpixel, and the remaining subpixel between the corresponding light-emitting layer and the element substrate is set taking interference of light into consideration. Therefore, in this light-emitting device, the brightness of the red subpixel, the blue subpixel, and the remaining subpixel can be increased. The spectrum of light emitted from the light-emitting layer in the remaining subpixel ranges broadly. If light corresponding to one of the wavelengths of light emitted from the light-emitting layer of the remaining subpixel is intensified because of interference, the remaining subpixel may display a color different from a predetermined color (pink or white). In this light-emitting device, however, the red subpixel, the blue subpixel, and the remaining subpixel have the transmissive layers of the same thickness that simultaneously intensifies light having a wavelength of a red peak and light having a wavelength of a blue peak because of interference. Therefore, light having a wavelength of a red peak (orange light, for example) and light having a wavelength of a blue peak (blue light, for example) included in the light emitted from the respective light-emitting layers are intensified because of interference. These two kinds of light are major components of two-peak white light. Hence, in this light-emitting device, a reduction in the color purity of the remaining subpixel can be suppressed, while the brightness in the red subpixel, the blue subpixel, and the remaining subpixel can be increased.

The light-emitting device according to the first aspect of the invention may further include a planar element substrate. It is preferable that the light-emitting layer of each of the four subpixels be provided on the element substrate. It is also preferable that the light-emitting layer of each of the red, green, and blue subpixels be disposed between the corresponding color filter and the element substrate. It is also preferable that each of the four subpixels have a transmissive layer that transmits light and is disposed between the corresponding light-emitting layer and the element substrate. It is also preferable that each of the red, green, and blue subpixels have a reflective layer that reflects light and is disposed between the corresponding transmissive layer and the element substrate.

This structure also provides a top-emission light-emitting device. In this light-emitting devices appropriate thickness setting of the transmissive layers taking interference of light into consideration leads to an increase in the brightness of at least one of the red, green, and blue subpixels. Further, appropriate setting of the transmissive layers of the red, green, and blue subpixels to have different thicknesses taking interference of light into consideration leads to an increase in the brightness of all the red, green, and blue subpixels. This means that, in this light-emitting device, appropriate thickness setting of the transmissive layers taking interference of light into consideration leads to a further reduction in power consumption and a further improvement of display quality.

The light-emitting device according to the first aspect of the invention may further include a planar element substrate. It is preferable that the light-emitting layer of each of the four subpixels be provided on the element substrate. It is also preferable that the color filter of each of the red, green, and blue subpixels be disposed between the corresponding light-emitting layer and the element substrate. It is also preferable that each of the red, green, and blue subpixels have a semi-reflective layer, which is transmissive and reflective, disposed between the corresponding light-emitting layer and the corresponding color filter. This structure provides a bottom-emission light-emitting device, in which light emitted from the light-emitting layers is output through the element substrate. This light-emitting device can be manufactured in a sufficiently simple manner and realize sufficiently high display quality with low power consumption. In this light-emitting device, the semi-reflective layers of the red, green, and blue subpixels may also serve as electrodes thereof.

In the light-emitting device according to the first aspect of the invention, it is preferable that the remaining subpixel, the red subpixel, and the blue subpixel be arranged such that the other subpixel is not disposed therebetween and have a common light-emitting layer. With this structure, the light-emitting layers of all of the remaining subpixel, the red subpixel, and the blue subpixel can be formed integrally in an easy manner. In addition to the light-emitting layers, organic functional layers and the transmissive layers of the remaining subpixel, the red subpixel, and the blue subpixel may also be formed integrally.

According to a second aspect of the invention, an electronic apparatus includes the light-emitting device according to the first aspect of the invention. The electronic apparatus provides the same advantages as the light-emitting device included therein.

According to a third aspect of the invention, a method for manufacturing a light-emitting device including a plurality of pixels constituting a screen, each of the pixels including four subpixels, which are a red subpixel, a green subpixel, a blue subpixel, and a remaining subpixel, wherein the red subpixel has a light-emitting layer made of a white-light-emitting material and extending along the screen, and a color filter provided above the light-emitting layer to transmit red light, the white-light-emitting material emitting two-peak white light having an emission spectrum including a valley between a red peak residing in a wavelength range of red light and a blue peak residing in a wavelength range of blue light; wherein the blue subpixel has a light-emitting layer made of the white-light-emitting material and extending along the screen, and a color filter provided above the light-emitting layer to transmit blue light; wherein the remaining subpixel has a light-emitting layer made of the white-light-emitting material and extending along the screen; wherein the green subpixel has a light-emitting layer made of a green-light-emitting material that emits green light and extending along the screen, and a color filter provided above the light-emitting layer to transmit green light; and wherein the remaining subpixel, the red subpixel, and the blue subpixel are arranged such that the other subpixel is not disposed therebetween, the method includes integrally forming the light-emitting layers of the red subpixel, the blue subpixel, and the remaining subpixel with the white-light-emitting material on an element substrate extending along the screen.

The light-emitting device manufactured by this method has sufficiently high display quality with low power consumption. In this method, the light-emitting layers of the red subpixel, the blue subpixel, and the remaining subpixel are formed integrally. Thus, by this method, a light-emitting device that has sufficiently high display quality with low power consumption can be manufactured in a sufficiently simple manner.

BRIEF DESCRIPTION OF THE DRAWINGS

The invention will be described with reference to the accompanying drawings, wherein like numbers reference like elements.

FIG. 4 is a graph showing the utilization efficiencies of emitted light in a red subpixel 1R, a blue subpixel 11, and a pink subpixel 1P of the light-emitting device 10.

FIG. 5 is a graph showing the utilization efficiency of emitted light in a green subpixel 1G of the light-emitting device 10.

FIG. 17 is a sectional view of a pixel P4 included in a light-emitting device according to a fourth embodiment of the invention.

FIG. 18 is a sectional view of a pixel P5 included in a light-emitting device according to a fifth embodiment of the invention.

DESCRIPTION OF EXEMPLARY EMBODIMENTS

Embodiments of the invention will now be described with reference to the drawings, in which layers and components are appropriately scaled regardless of the actual dimensions.

First Embodiment

Figure 1:
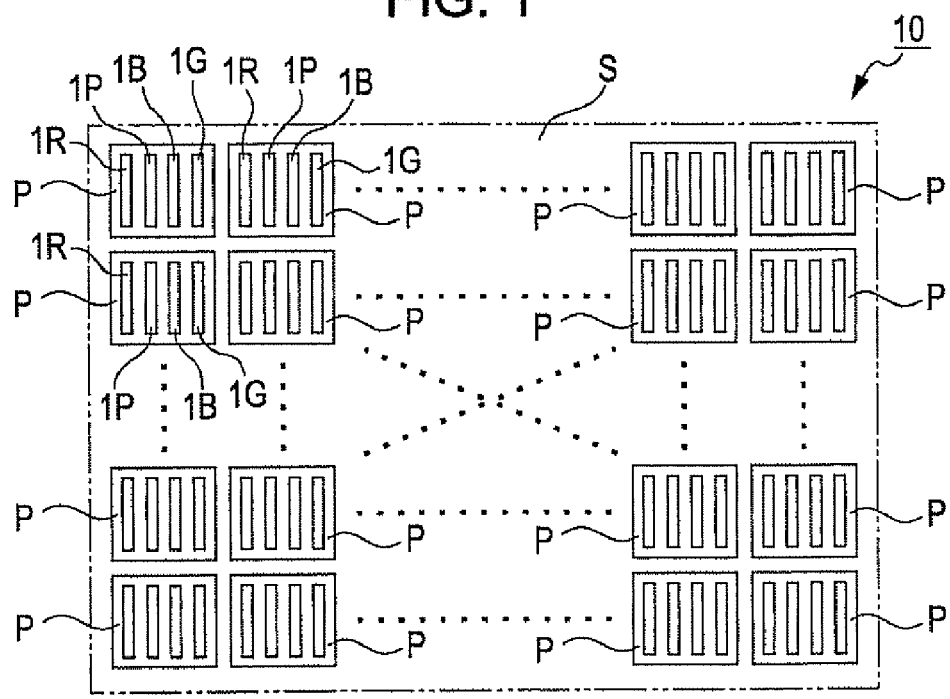
FIG. 1 is a plan view of a light-emitting device 10 according to a first embodiment of the invention.

FIG. 1 is a plan view of a light-emitting device 10 according to a first embodiment of the invention. The light-emitting device 10 is a full-color display device including a plurality of pixels P that constitute a rectangular screen S. The pixels P are arranged in a matrix on the screen S. Each of the pixels P includes four subpixels 1 that also constitute the screen S. The four subpixels 1 include a red subpixel 1R that emits red light to display red, a green subpixel 1G that emits green light to display green, a blue subpixel 1B that emits blue light to display blue, and a pink subpixel 1P that emits pink light to display pink. These subpixels 1 are aligned in a stripe pattern on the screen S. In each of the pixels P, white is displayed by the cooperation of the pink subpixel 1P and the green subpixel 1G. Further, the pink subpixel 1P, the red subpixel 1R, and the blue subpixel 1B are arranged such that no other subpixel 1 is disposed therebetween. That is, each of the red subpixel 1R and the blue subpixel 1B is disposed next to the pink subpixel 11.

Figure 2:
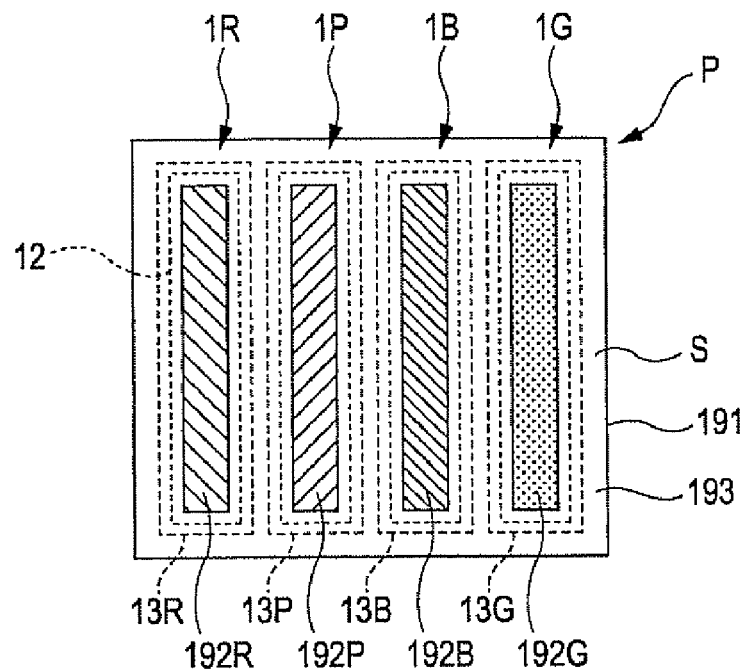
FIG. 2 is a plan view of a pixel P included in the light-emitting device 10.
Figure 3:
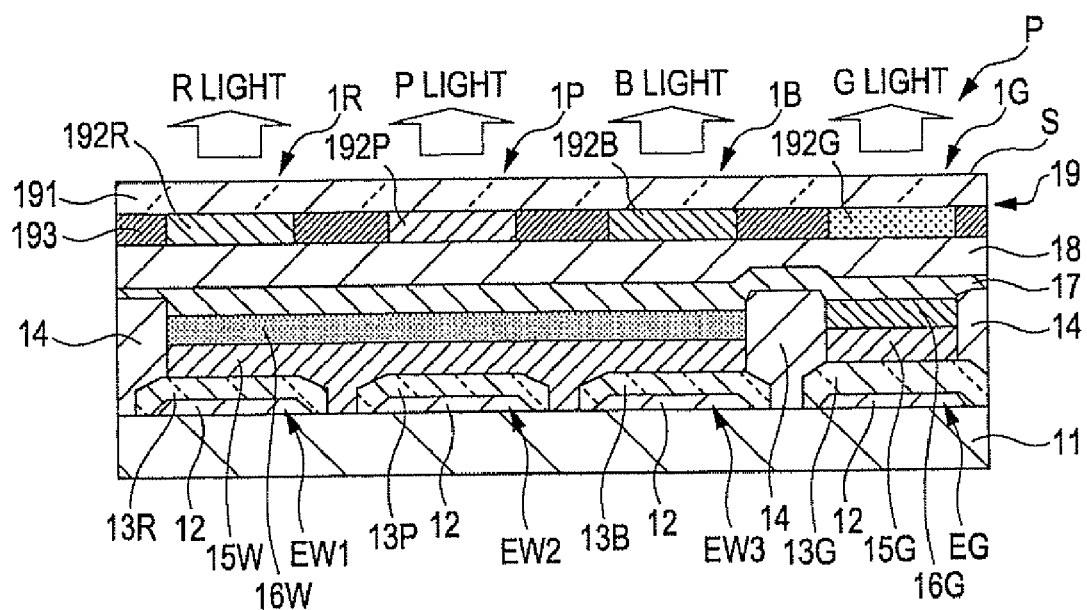
FIG. 3 is a sectional view of the pixel P.

FIG. 2 is a plan view of the pixel P included in the light-emitting device 10, and FIG. 3 is a sectional view of the pixel P. In FIGS. 2 and 3, the same components are hatched with the same patterns. Referring to FIG. 3, the light-emitting device 10 has an element substrate 11. The element substrate 11 is a planar substrate, on which a plurality of light-emitting elements E are disposed, The light-emitting elements E are organic EL elements. Each of the light-emitting elements E corresponds to one of the subpixels 1 and constitutes a part of the subpixel 1. Specifically, the red subpixel 1R includes a white-light-emitting element EW1, the green subpixel 1G includes a green-light-emitting element EG, the pink subpixel 1P includes a white-light-emitting element EW2, and the blue subpixel 1B includes a white-light-emitting element EW3.

The element substrate 11 is made of, for example, glass, ceramic, or metal, on which active elements such as thin-film transistors (TFTs) can be disposed. Reflective layers 12 that totally reflect light are provided on the element substrate 11 so as to correspond to the subpixels 1. The reflective layers 12 may be made of, for example, silver, aluminum, silver alloy, aluminum alloy, or silver aluminum alloy. A passivation layer (not shown) is provided on the element substrate 11 and the reflective layers 12. The passivation layer has a thickness of 200 nm, for example, and is made of silicon nitride, for example. The light-emitting elements E are provided on the element substrate 11 and the reflective layers 12, i.e., on the passivation layer, so as to correspond to the subpixels 1. Detailed description will be made below.

Transparent electrodes (transmissive layers) 13 made of a transmissive material such as indium tin oxide (ITO) are provided on the element substrate 11 and the reflective layers 12, i.e., on the passivation layer, so as to correspond to the subpixels 1 and to cover the reflective layers 12. The pixel P includes four transparent electrodes 13, namely, a red transparent electrode 13R, a green transparent electrode 13G, a blue transparent electrode 13B, and a pink transparent electrode 13P. The thicknesses of the red transparent electrode 13R, the blue transparent electrode 13B, and the pink transparent electrode 13P are the same. The thickness of the green transparent electrode 13G is, for example, 110 nm. These transparent electrodes 13 serve as positive electrodes of the light-emitting elements E.

Partitions 14, which define organic-layer regions for all of the light-emitting elements E with the transparent electrodes 13, are provided on the element substrate 11 and the transparent electrodes 13, i.e., on the passivation layer and the transparent electrodes 13. The pixel P includes two organic-layer regions. One of these organic-layer regions is for the white-light-emitting elements EW1 to EW3, in which a white hole-injection layer 15W, a white-light-emitting layer 16W, and a white electron-injection layer (not shown) are provided in sequence from the bottom. The other organic-layer region is for the green-light-emitting element EG, in which a green hole-injection layer 15G, a green-light-emitting layer 16G, and a green electron-injection layer (not shown) are provided in sequence from the bottom.

In the pixel P, the white-light-emitting layer 16W is a common layer shared by the pink subpixel 1P, the red subpixel 1R, and the blue subpixel 1B. Therefore, in the pixel P, the white-light-emitting layer 16W, the common layer, serves as the light-emitting layer of the pink subpixel 1P (pink-light-emitting layer) at one part, serves as the light-emitting layer of the red subpixel 1R (red-light-emitting layer) at another part, and serves as the light-emitting layer of the blue subpixel 1B (blue-light-emitting layer) at the remaining part. The light-emitting layers 16 are provided on the screen S (the element substrate 11), and have a thickness of, for example, 30 nm. The hole-injection layers 15 have a thickness of, for example, 80 nm. The electron-injection layers have a thickness of, for example, 20 nm. Organic functional layers that do not emit light by themselves, such as the hole-injection layer and a hole-transporting layer, may be provided as common layers shared by all the pixels.

As described above, the four subpixels 1 in the pixel P include the transmissive layers (transparent electrodes 13) between the corresponding light-emitting layers 16 and the element substrate 11, and the reflective layers 12 between the corresponding transmissive layers (transparent electrodes 13) and the element substrate 11. The white-light-emitting layer 16W is made of an organic EL material that emits white light (hereinafter referred to as a "white-light-emitting material"), and the green-light-emitting layer 16G is made of an organic EL material that emits green light (hereinafter referred to as a "green-light-emitting material"). The emission spectrum of the white-light-emitting material includes two peaks. The wavelength of a first peak, one of the two peaks, corresponds to red light (orange light, for example), and the wavelength of a second peak, the other peak, corresponds to blue light (sky-blue light, for example).

A common electrode 17 shared by all the light-emitting elements E and serving as a negative electrode of all the light-emitting elements E is provided on the electron-injection layers. The common electrode 17 is a semi-reflective layer, which is transmissive and reflective, having a thickness of 10 nm, and is made of a magnesium silver alloy, for example. As described above, the element substrate 11 has the reflective layers 12 and the light-emitting elements E provided thereon so as to correspond to the subpixels 1.

At each of the light-emitting elements E, the thickness of the transparent electrode 13 is set such that an optical distance between the common electrode 17 and the reflective layer 12 positioned immediately below the light-emitting element E intensifies particular color light displayed by the corresponding subpixel 1, among light emitted from the light-emitting layer, because of interference of light. Specifically, the red transparent electrode 13R, the blue transparent electrode 13B, and the pink transparent electrode 13P are set to have a common thickness that produces the aforementioned optical distance such that light having a wavelength of red light (590 nm to 640 nm, or preferably light having a wavelength of about 620 nm) and light having a wavelength of blue light (450 nm to 500 nm, or preferably light having a wavelength of about 480 nm) are intensified because of interference. The green transparent electrode 13G is set to have a thickness that produces the aforementioned optical distance such that light having a wavelength of green light (500 nm to 570 nm, or preferably light having a wavelength of about 530 µm) is intensified because of interference.

A sealing layer 18 is provided on the common electrode 17, which is provided on the element substrate 11, so as to cover all the light-emitting elements E. The sealing layer 18 serves to seal and protect the light-emitting elements F, and is made of a transmissive material such as silicon oxynitride or silicon oxide. The sealing layer 18 is bonded with a color filter substrate 19. The color filter substrate 19 includes a transparent substrate 191, which is planar and transmissive, color filters 192 (a red color filter 192R, a blue color filter 192B, a pink color filter 192P, and a green color filter 192G) provided so as to correspond to the subpixels 1, and a light-shielding black matrix 193.

The color filters 192 are provided below the transparent substrate 191, each of which basically transmits specific color light. For example, the red color filter 192R only transmits red light, the blue color filter 192B only transmits blue light, the pink color filter 192P only transmits pink light (red light and blue light), and the green color filter 192G only transmits green light. The black matrix 193 is provided below the transparent substrate 191 and is arranged so as to fill gaps between the color filters 192.

The color filter substrate 19 is in contact with the sealing layer 18 at the surface provided with the color filters 192. In the pixel P, the red color filter 192R overlaps the red-light-emitting layer, the pink color filter 192P overlaps the pink-light-emitting layer, the blue color filter 192B overlaps the blue-light-emitting layer, and the green color filter 192G overlaps the green-light-emitting layer 16G. That is, in the pixel P, the light-emitting layers of the subpixels 1 are provided on the element substrate 11 so as to be sandwiched between the corresponding color filters 192 and the element substrate 11.

In the pixel P, the red subpixel 1R includes the red-light-emitting layer and the red color filter 192R that overlaps the red-light-emitting layer, the pink subpixel 1P includes the pink-light-emitting layer and the pink color filter 192P that overlaps the pink-light-emitting layer, the blue subpixel 1B includes the blue-light-emitting layer and the blue color filter 192B that overlaps the blue-light-emitting layer, and the green subpixel 1G includes the green-light-emitting layer 16G and the green color filter 192G that overlaps the green-light-emitting layer 16G.

As is clear from the foregoing description, the light-emitting device 10 is a top-emission organic EL device. Therefore, light emitted from the light-emitting layers is output in a direction away from the element substrate, i.e., through the color filter substrate 19. Because light emitted from the light-emitting layers passes through the color filters 192, the light emitted from the red subpixel 1R (R light) is output in red, the light emitted from the pink subpixel 1P (P light) is output in pink, the light emitted from the blue subpixel 1B (B light) is output in blue, and the light emitted from the green subpixel 1G (G light) is output in green.

As described above, the light-emitting device 10 includes the plurality of pixels P, each of which includes four subpixels 1, namely, the red subpixel 1R, the pink subpixel 1P, the blue subpixel 1B, and the green subpixel 1G. The red subpixel 1R includes the red-light-emitting layer made of the white-light-emitting material, and the red color filter 192R that overlaps the red-light-emitting layer. The pink subpixel 1P includes the pink-light-emitting layer made of the white-light-emitting material, and the pink color filter 192P that overlaps the pink-light-emitting layer. The blue subpixel 1B includes the blue-light-emitting layer made of the white-light-emitting material, and the blue color filter 192B that overlaps the blue-light-emitting layer. The green subpixel 1G includes the green-light-emitting layer 16G made of the green-light-emitting material, and the green color filter 192G that overlaps the green-light-emitting layer 16G.

Since the light-emitting device 10 has a sufficiently high utilization efficiency of light emitted from the light-emitting layers in all the subpixels, the light-emitting device 10 realizes sufficiently high display quality with low power consumption. Further, since the light-emitting layers of the red subpixel 1R, the pink subpixel 1P, and the blue subpixel 1B in the light-emitting device 10 are made of the same material (the white-light-emitting material), only two types of light-emitting materials (the white-light-emitting material and the green-light-emitting material) for the light-emitting layers are required in manufacturing the light-emitting device 10. Therefore, the process of manufacturing the light-emitting device 10 is simplified. Accordingly, the light-emitting device 10 can be manufactured in a sufficiently simple manner while realizing sufficiently high display quality with low power consumption.

As described above, the light-emitting device 10 is a top-emission organic EL device having the element substrate 11. In the subpixels 1 of the pixel P, the light-emitting layers are provided on the element substrate 11 so as to be sandwiched between the corresponding color filters 192 and the element substrate 11. The subpixels 1 include the transmissive layers (the transparent electrodes 13) between the corresponding light-emitting layers and the element substrate 11, and the reflective layers 12 between the corresponding transmissive layers and the element substrate 11. At each of the light-emitting elements E of the light-emitting device 10, the thickness of the transparent electrode 13 is set such that an optical distance between the common electrode 17 and the reflective layer 12 positioned immediately below the light-emitting element E intensifies specific color light displayed by the corresponding subpixel 1, among light emitted from the light-emitting layer, because of interference of light. Accordingly, with the light-emitting device 10, the brightness of the subpixels 1 can be increased.

FIG. 4 is a graph showing the utilization efficiencies of emitted light in the red subpixel 1R, the blue subpixel 1B, and the pink subpixel 1P of the light-emitting device 10. The graph shows the emission spectra of the light-emitting layers, the transmission characteristics of the color filters 192, and the emission spectra of the color filters 192 (R light, B light, and P light) with respect to the red subpixel 1R, the blue subpixel 1B, and the pink subpixel 1P. The graph shows that the utilization efficiencies of emitted light in the red subpixel 1R and the blue subpixel 1B are about 60% to 80%, which are sufficiently high. Because red and blue are less easily perceived in human vision than green, sufficiently high utilization efficiencies of red light and blue light lead directly to a reduction in power consumption. The graph also shows that the utilization efficiency of emitted light in the pink subpixel 1P is sufficiently high. It is understood that, in the light-emitting device 10, green light, which is easily perceived in human vision, is blocked by the pink color filter 192P in the pink subpixel 1P, whereby reflection of external light is sufficiently suppressed.

FIG. 5 is a graph showing the utilization efficiency of emitted light in the green subpixel 1G of the light-emitting device 10. The graph shows the emission spectrum of the light-emitting layer, the transmission characteristic of the green color filter 192G, and the emission spectrum of the green color filter 192G (G light). The graph shows that the utilization efficiency of emitted light in the green subpixel 1G is about 70%, which is sufficiently high.

A method for manufacturing the light-emitting device 10 will now be described.

Figure 6:
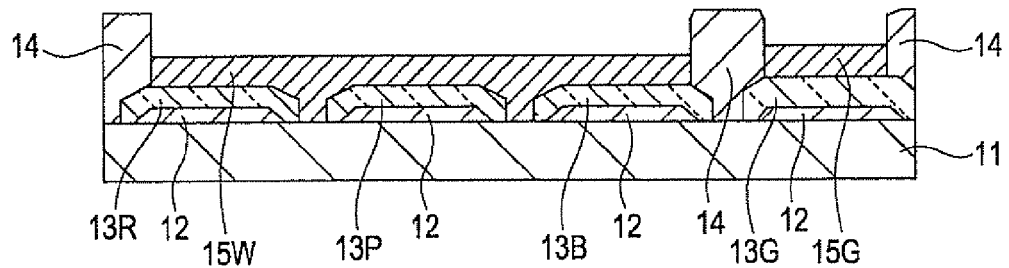
FIG. 6 is a sectional view showing a first step of manufacturing the light-emitting device 10.

Referring to FIG. 6, the reflective layers 12 are formed on the element substrate 11 so as to correspond to the subpixels 1. The passivation layer (not shown) is formed on the element substrate 11 and the reflective layers 12. The transparent electrodes 13 are formed thereon so as to cover the reflective layer 12 and so as to correspond to the subpixels 1. The partitions 14 are formed on the passivation layer (not shown) and the transparent electrodes 13 so as to define the organic-layer regions for all the light-emitting elements E. The hole-injection layers 15 are deposited in the organic-layer regions. The deposition of the organic functional layers including the hole-injection layers 15 can be performed by vapor deposition, application, sputtering, or chemical vapor deposition (CVD), for example.

In forming the transparent electrodes 13, the thicknesses thereof need to be set in accordance with the types of the subpixels 1 (a group of the red subpixel 1R, the blue subpixel 1B, and the pink subpixel 1P, or the green subpixel 1G). The thicknesses of the transparent electrodes 13 can be controlled by, for example, repeated deposition. Two types of materials are used in forming the hole-injection layers 15. The white hole-injection layer 15W is formed in the organic-layer region for the white-light-emitting elements EW1 to EW3, and the green hole-injection layer 15G is formed in the organic-layer region for the green-light-emitting element EG. Because the hole-injection layers can often be shared, they may be formed as a common layer for all the light-emitting elements.

Figure 7:
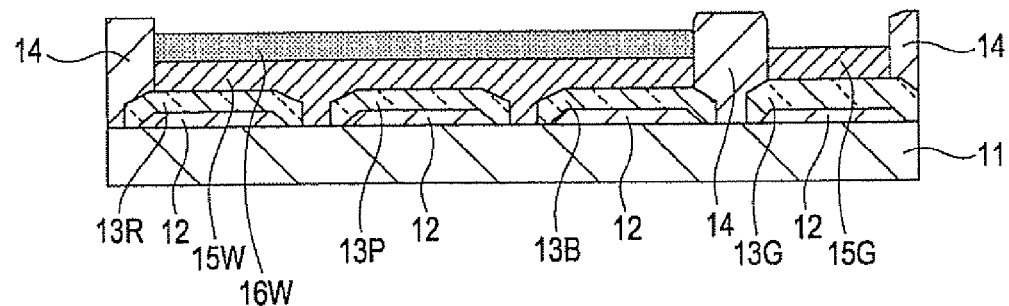
FIG. 7 is a sectional view showing a manufacturing step subsequent to the step shown in FIG. 6.
Figure 8:
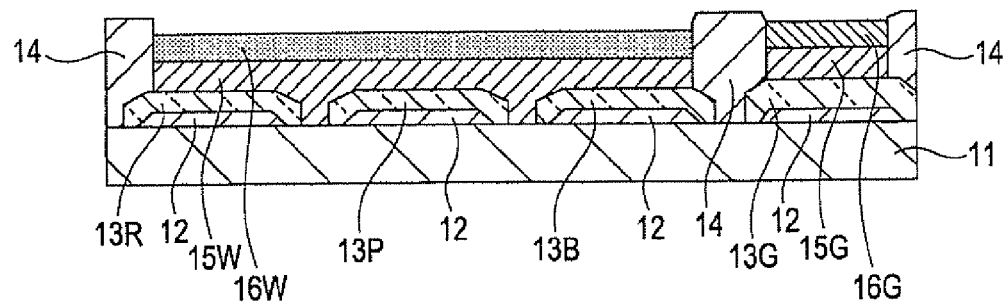
FIG. 8 is a sectional view showing a manufacturing step subsequent to the step shown in FIG. 7.

Referring to FIG. 7, in each of the pixels P, the white-light-emitting layer 16W is formed in the organic-layer region for the white-light-emitting elements EW1 to EW3 by depositing the white-light-emitting material. Referring to FIG. 8, the green-light-emitting layer 16G is formed in the organic-layer region for the green-light-emitting element EG by depositing the green-light-emitting material. That is, two types of materials are used in forming the light-emitting layers 16. In forming the white-light-emitting layer 16W, the light-emitting layers for the white-light-emitting elements EW1 to EW3 in each pixel P are integrally formed with the white-light-emitting material.

Figure 9:
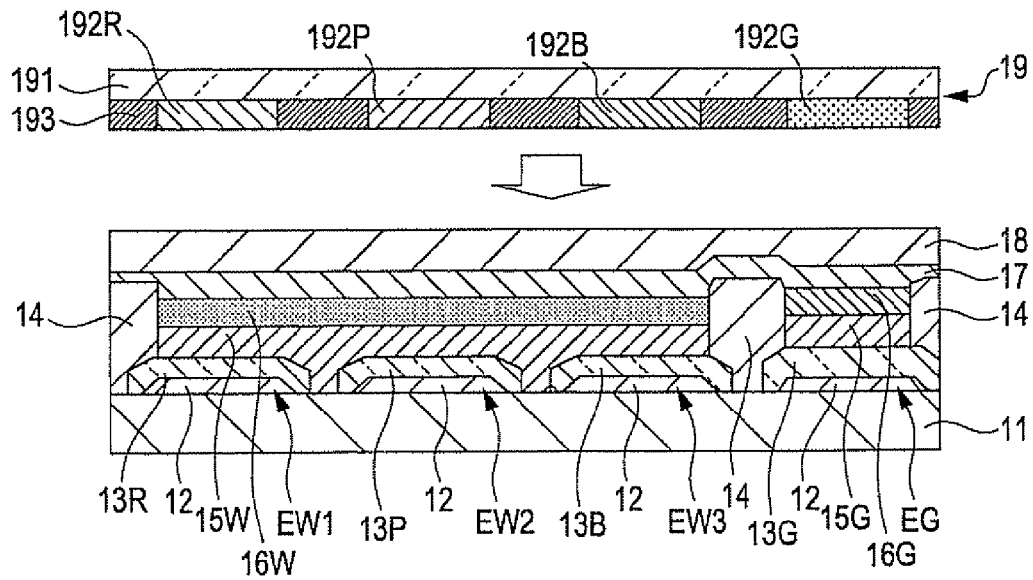
FIG. 9 is a sectional view showing a manufacturing step subsequent to the step shown in FIG. 8.

Referring to FIG. 9, the electron-injection layers (not shown) are formed in the organic-layer regions by deposition. The common electrode 17 is formed on the electron-injection layers and the partitions 14. Then, the sealing layer 18 is formed on the common electrode 17, which is provided on the element substrate 11, and the color filter substrate 19 is bonded thereto. The light-emitting device 10 shown in FIG. 3 is thus completed. As has been described, the light-emitting device 10 according to the first embodiment of the invention will not complicate the manufacturing process.

Second Embodiment

Figure 10:
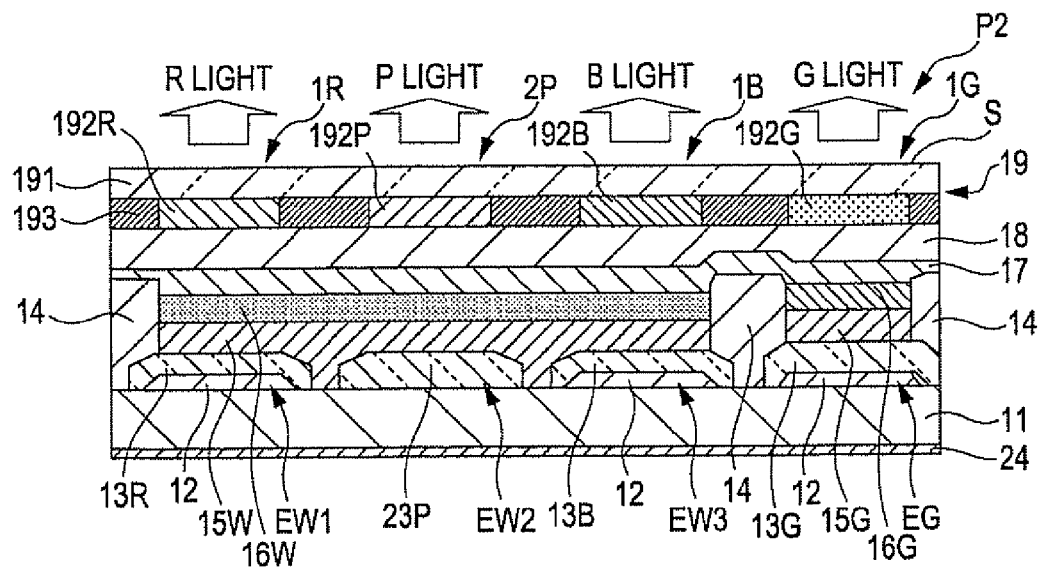
FIG. 10 is a sectional view of a pixel P2 included in a light-emitting device according to a second embodiment of the invention.

FIG. 10 is a sectional view of a pixel P2 included in a light-emitting device according to a second embodiment of the invention. The pixel P2 is equivalent to the pixel P included in the light-emitting device 10. The light-emitting device in FIG. 10 differs from the light-emitting device 10 in that the former includes a pink subpixel 2P instead of the pink subpixel 1P, that the former includes a light-absorbing layer 24 that absorbs light and underlies the element substrate 11, and that the material for the element substrate 11 is limited to a transmissive material such as glass. The pink subpixel 2P differs from the pink subpixel 1P in that the pink subpixel 2P does not include the reflective layer 12 and that the pink subpixel 2P includes a pink transparent electrode 23P instead of the pink transparent electrode 13P. The pink transparent electrode 23P differs from the pink transparent electrode 13P only in terms of shape. This difference is attributed to the absence of the reflective layer 12. The pink transparent electrode 23P may also be made of a light-shielding material.

In the light-emitting device of the second embodiment, in which the pink subpixel 2P does not include the reflective layer 12, the utilization efficiency of emitted light in the pink subpixel 2P is lower than that in the pink subpixel 1P of the first embodiment. Instead, the light-emitting device of the second embodiment rarely causes a problem that light corresponding to a particular one of wavelengths of light emitted from the light-emitting layer in the pink subpixel 2P is intensified because of interference, thereby altering the perceived color of the P light. Accordingly, the light-emitting device of the second embodiment can suppress a reduction in the purity of a color displayed by the pink subpixel 2P. Further, in the light-emitting device of the second embodiment, redundant light is absorbed by the light-absorbing layer 24, whereby the contrast of the pink subpixel 2P is not reduced in spite of the transmissive characteristic of the element substrate 11 included in the light-emitting device.

If it is acceptable that the utilization efficiency of emitted light in the pink subpixel is lower than that in the first embodiment, as in the light-emitting device of the second embodiment, other embodiments are also available. For example, the first embodiment may be modified such that the pink transparent electrode 13P has any thickness from 70 nm to 130 nm. This modification may be further modified to design the pink transparent electrode 13P to have a thickness producing the optical distance between the common electrode 17 and the reflective layer 12 provided immediately under the pink transparent electrode 13P such that light having a wavelength of blue light (450 nm to 500 nm, or preferably light having a wavelength of about 480 nm) or light having a wavelength of red light (590 nm to 640 nm, or preferably light having a wavelength of about 620 nm) is intensified because of interference. In this case, however, a problem may occur in that light corresponding to a particular one of wavelengths of light (blue or red light) emitted from the pink subpixel is intensified because of interference, thereby altering the perceived color of the P light. Another embodiment capable of avoiding this problem and different from the first embodiment will now be described.

Third Embodiment

Figure 11:
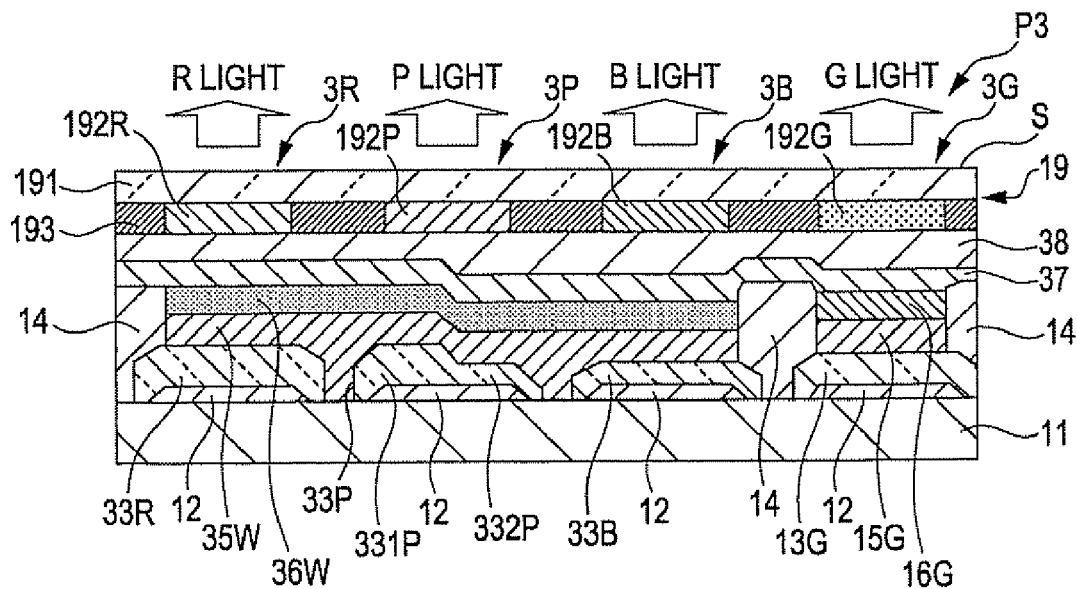
FIG. 11 is a sectional view of a pixel P3 included in a light-emitting device according to a third embodiment of the invention.
Figure 12:
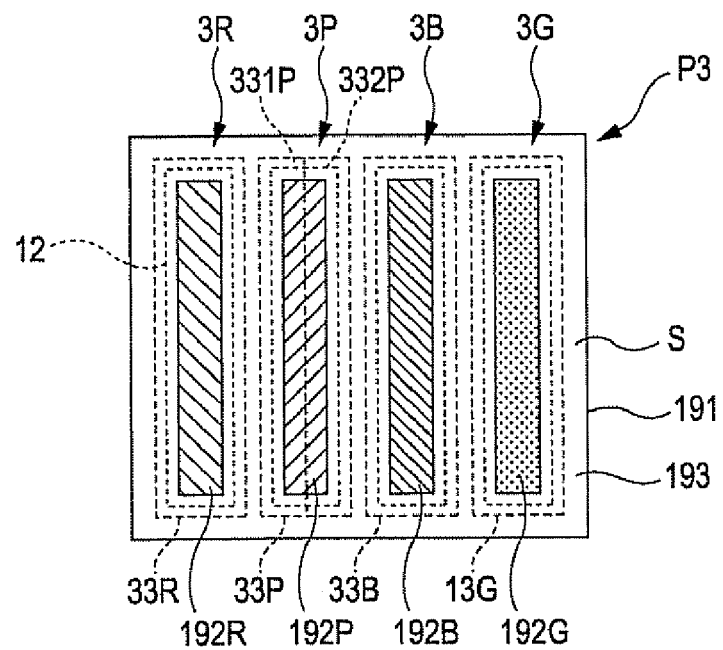
FIG. 12 is a plan view of the pixel P3.

FIG. 11 is a sectional view of a pixel P3 included in a light-emitting device according to a third embodiment of the invention. FIG. 12 is a plan view of the pixel P3. The pixel P3 is equivalent to the pixel P included in the light-emitting device 10. The light-emitting device in FIGS. 11 and 12 differs from the light-emitting device 10 in that the pixel P3 includes a red subpixel 3R, a pink subpixel 3P, a blue subpixel 3B, and a green subpixel 3G instead of the red subpixel 1R, the pink subpixel 1P, the blue subpixel 1B, and the green subpixel 1G.

The red subpixel 3R, the pink subpixel 3P, and the blue subpixel 3B significantly differ from the red subpixel 1R, the pink subpixel 1P, and the blue subpixel 1B in that the former include a red transparent electrode 33R (transmissive layer), a pink transparent electrode 33P (transmissive layer), and a blue transparent electrode 33B (transmissive layer) having different thicknesses instead of the red transparent electrode 13R, the pink transparent electrode 13P, and the blue transparent electrode 13B having the same thickness. For example, the red transparent electrode 33R has a thickness of 130 nm, and the blue transparent electrode 33B has a thickness of 85 nm.

The pink transparent electrode 33P includes portions 331P and 332P having different thicknesses. Each of the portions 331P and 332P has a thickness that intensifies light having a wavelength corresponding to one of the two peaks in the emission spectrum of the white-light-emitting material because of interference. Specifically, the thickness of the portion 331P is designed such that light having a wavelength of red light (590 nm to 640 nm, or preferably light having a wavelength of about 620 nm) is intensified because of interference. The thickness of the portion 332P is set such that light having a wavelength of blue light (450 nm to 500 nm, or preferably light having a wavelength of about 480 nm) is intensified because of interference.

The thickness of the red transparent electrode 33R is set such that light having a wavelength of red light (590 nm to 640 nm, or preferably light having a wavelength of about 620 nm) is intensified because of interference. The thickness of the blue transparent electrode 33B is designed such that light having a wavelength of blue light (450 nm to 500 nm, or preferably light having a wavelength of about 480 nm) is intensified because of interference. In accordance with the differences in the shapes of the red transparent electrode 33R, the pink transparent electrode 33P, and the blue transparent electrode 33B from those of the red transparent electrode 13R, the pink transparent electrode 13P, and the blue transparent electrode 13B, the shapes of the white hole-injection layer, the white-light-emitting layer, the electron-injection layer (not shown), the common electrode, and the sealing layer in the third embodiment differ from those in the first embodiment. These differences in terms of shape result in the green subpixel 3G being significantly different from the green subpixel 1G.

In the light-emitting device of the third embodiment, light corresponding to a particular one of wavelengths of light emitted from the light-emitting layer in each of the red subpixel 3R, the pink subpixel 3P, and the blue subpixel 3B is intensified because of interference. Therefore, with the light-emitting device of the third embodiment, the brightness can be increased in the red subpixel 3R, the pink subpixel 3P, and the blue subpixel 3B. Especially in the pink subpixel 3P, light corresponding to both of the two peak wavelengths (red and blue light) in the emission spectrum of the light-emitting layer are intensified because of light interference. This suppresses the occurrence of the problem that light corresponding to a particular one of wavelengths is intensified because of interference, thereby altering the perceived color of the P light. Accordingly, the light-emitting device of the third embodiment can suppress a reduction in the purity of a color displayed by the pink subpixel.

Next, a method for manufacturing the light-emitting device of the third embodiment will be described.

Figure 13:
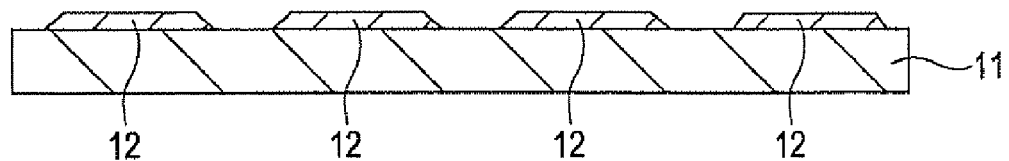
FIG. 13 is a sectional view showing a first step of manufacturing the light-emitting device according to the third embodiment of the invention.

Referring to FIG. 13, the reflective layers 12 are formed on the element substrate 11 in regions corresponding to the subpixels 3. Then, a passivation layer (not shown) is formed over the element substrate 11 and the reflective layers 12. Next, referring to FIGS. 14 to 16, the transparent electrodes 33 are formed on the passivation layer (not shown) in regions corresponding to the subpixels 3 so as to cover the reflective layers 12.

The transparent electrodes 33 are formed in the following steps.

Figure 14:
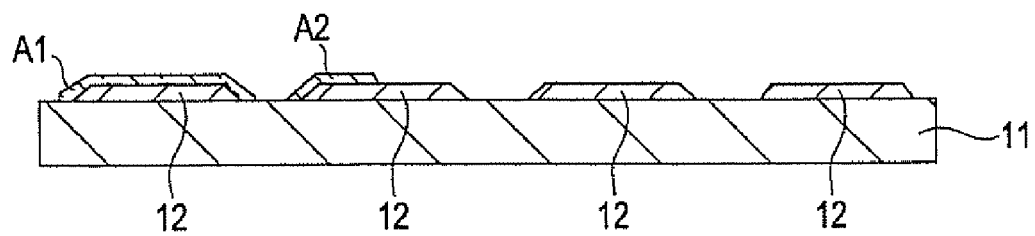
FIG. 14 is a sectional view showing a manufacturing step subsequent to the step shown in FIG. 13.

Referring to FIG. 14, a material (transparent material) for forming the transparent electrodes 33 is provided on the passivation layer (not shown) to form subtransmissive layers A1 and A2 simultaneously. Specifically, a subtransmissive layer having a thickness of A is formed so as to spread over all the reflective layers 12 (a formation step), and then unnecessary portions of the subtransmissive layer are removed by etching (a removal step). The remaining portions form the subtransmissive layers A1 and A2. The subtransmissive layer A1 covers the reflective layer 12 in the red subpixel 3R. The subtransmissive layer A2 covers part of the reflective layer 12 in the pink subpixel 3P (a portion of a surface parallel with the element substrate 11 in the pink subpixel 3P).

Figure 15:
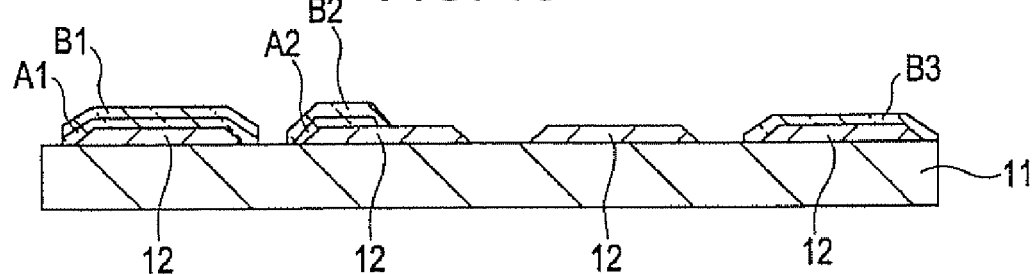
FIG. 15 is a sectional view showing a manufacturing step subsequent to the step shown in FIG. 14.

Next, referring to FIG. 15, the material for forming the transparent electrodes 33 is again provided on the resultant structure to form subtransmissive layers B1 to B3 simultaneously. Specifically, a subtransmissive layer having a thickness of B is formed so as to spread over all the reflective layers 12, and then unnecessary portions of the subtransmissive layer are removed by etching. The remaining portions form the subtransmissive layers B1 to B3. The subtransmissive layer B1 covers the reflective layer 12 in the red subpixel 3R. The subtransmissive layer B2 covers part of the reflective layer 12 in the pink subpixel 3P (a portion of a surface parallel with the element substrate 11 in the pink subpixel 3P). The subtransmissive layer B3 covers the reflective layer 12 in the green subpixel 3G.

Figure 16:
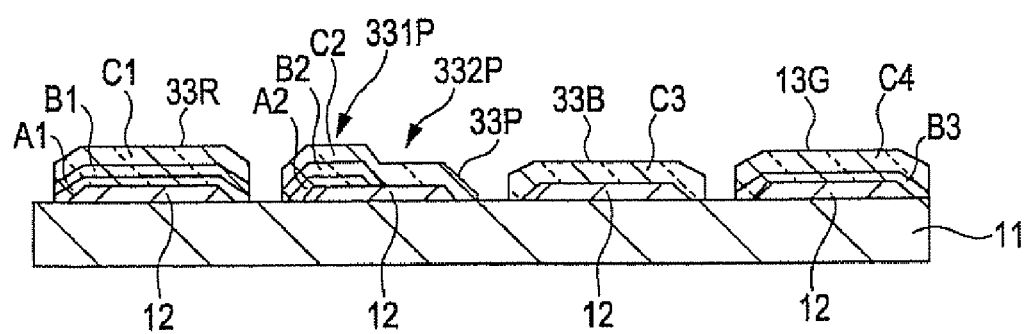
FIG. 16 is a sectional view showing a manufacturing step subsequent to the step shown in FIG. 15.

Next, referring to FIG. 16, the material for forming the transparent electrodes 33 is again provided on the resultant structure to form subtransmissive layers C1 to C4 simultaneously. Specifically, a subtransmissive layer having a thickness of C is formed so as to spread over all the reflective layers 12, and then unnecessary portions of the subtransmissive layer are removed by etching. The remaining portions form the subtransmissive layers C1 to C4. The subtransmissive layer C1 covers the reflective layer 12 in the red subpixel 3R. The subtransmissive layer C2 covers part of the reflective layer 12 in the pink subpixel 3P (a portion of a surface parallel with the element substrate 11 in the pink subpixel 3P). The subtransmissive layer C3 covers the reflective layer 12 in the blue subpixel 3B. The subtransmissive layer C4 covers the reflective layer 12 in the green subpixel 3G.

In this manner, all the transparent electrodes 33 are formed.

As can be seen from the above description, the red transparent electrode 33R has a thickness of A+B+C, the green transparent electrode 33G has a thickness of B+C, and the blue transparent electrode 33B has a thickness of C. The pink transparent electrode 33P has a thickness of A+B+C in the portion 331P, and a thickness of C in the portion 332P. That is, in the step of forming the subtransmissive layers, when ideal thicknesses of the red, green, and blue transparent electrodes 33R, 33G, and 33B are defined as X, Y, and Z, respectively, the thicknesses A, B, and C are set as $A=X-Y$, $B=Y-Z$, and $C=Z-0=Z$. In other words, the thickness of the subtransmissive layer formed in the n-th order is equal to the difference between the thickness of the n-th thickest transparent electrode 33 and the thickness of the n+1-th thickest transparent electrode 33. It should be noted that the thickness of a nonexistent subtransmissive layer is defined as 0.

The method for manufacturing the light-emitting device according to the third embodiment includes repetition of the formation step in which a subtransmissive layer covering a portion of a surface parallel with the element substrate 11 in the pink subpixel 3P is formed by using a transmissive material and the removal step in which part of the subtransmissive layer formed in the formation step is removed. Therefore, the light-emitting device of the third embodiment enables formation of a fine structure that is difficult to form using a deposition mask, specifically formation of the portions 331P and 332P with different thicknesses as the pink transparent electrode 33P in the pink subpixel 3P.

Fourth Embodiment

FIG. 17 is a sectional view of a pixel P4 included in a light-emitting device according to a fourth embodiment of the invention. The pixel P4 is equivalent to the pixel P3 in FIG. 11. The pixel P4 differs from the pixel P3 in that the pixel P4 includes a red subpixel 4R, a pink subpixel 4P, a blue subpixel 4B, and a green subpixel 4G instead of the red subpixel 3R, the pink subpixel 3P, the blue subpixel 3B, and the green subpixel 3G.

The pink subpixel 4P significantly differs from the pink subpixel 3P in that the pink subpixel 4G includes a pink transparent electrode (transmissive layer) 43P instead of the pink transparent electrode 33P. The pink transparent electrode 43P includes a portion 431P having the same thickness as the portion 332P, and a portion 432P having the same thickness as the portion 331P. The pink transparent electrode 33P has the thicker portion 331P near the red subpixel 3R, whereas the pink transparent electrode 43P has the thinner portion 432P near the red subpixel 4R.

In accordance with the difference in the shape of the pink transparent electrode 43P from that of the pink transparent electrode 33P, the shapes of the white hole-injection layer, the white-light-emitting layer, the electron-injection layer (not shown), the common electrode, and the sealing layer in the fourth embodiment differ from those in the third embodiment. These differences in terms of shape result in the red, blue, and green subpixels 4R, 4B, and 4G being significantly different from the red, blue, and green subpixels 3R, 3B, and 3G.

The light-emitting device of the fourth embodiment also has the same advantage as the light-emitting device of the third embodiment. As is obvious from this fact, the sectional shape of the pink transparent electrode in the invention is not limited to those illustrated in the drawings. For example, the two portions may also be arranged to reside next to each other in a direction vertical to the cross-section shown in FIG. 17.

Fifth Embodiment

FIG. 18 is a sectional view of a pixel P5 included in a light-emitting device according to a fifth embodiment of the invention. The light-emitting device of the fifth embodiment is of the bottom-emission type. Therefore, the material for the element substrate 11 is limited to a transmissive material such as glass. The bottom-emission light-emitting device of the fifth embodiment includes the color filters 192 and the black matrix 193 disposed between the element substrate 11 and the transparent electrodes 13 instead of the reflective layers 12 and the color filter substrate 19.

That is, in each pixel P5, the light-emitting layers of subpixels 5 are provided on the element substrate 11, and the color filters 192 of a red subpixel 5R, a pink subpixel 5P, a blue subpixel 5B, and a green subpixel 5G are disposed at a level between the element substrate 11 and the light-emitting layers. Active elements such as thin-film transistors (TFTs) to be disposed on the element substrate 11, if necessary, are positioned on the black matrix 193 so as to be shielded by the black matrix 193.

The pixel P5 is equivalent to the pixel P2 in FIG. 10. The red subpixel 5R, the pink subpixel 5P, the blue subpixel 5B, and the green subpixel 5G are respectively equivalent to the red subpixel 1R, the pink subpixel 2P, the blue subpixel 1B, and the green subpixel 1G in FIG. 10. A common electrode 57 and a sealing layer 58 are respectively equivalent to the common electrode 17 and the sealing layer 18 in FIG. 10, and are made of a transparent material as in the case of the common electrode 17 and the sealing layer 18. The fifth embodiment may also be modified such that the common electrode 57 and the sealing layer 58 are made of a light-shielding material.

As described above, the invention can also be applied to a bottom-emission light-emitting device. Such a bottom-emission light-emitting device may further be modified to produce the same advantage as in the first to fourth embodiments. For example, a common electrode 77 made of a light-reflecting material may also be formed so as to intensify the emitted light by utilizing light interference. Another possible configuration is manufactured as follows: a passivation layer made of silicon nitride, for example, is formed over the color filters 192 and the black matrix 193, a thin-film layer made of a highly reflective material such as silver or aluminum is formed thereon with a thickness of about 5 nm to 15 nm as a semi-reflective layer (half mirror) having both transmissivity and reflectivity, and transparent electrodes are formed thereon. In such a case, the optical distance between the semi-reflective layer and the reflective layer (common electrode) can be adjusted by appropriately setting the thicknesses of the transparent electrodes, or the thicknesses of both the transparent electrodes and the organic functional layers. Another possible configuration is that the transparent electrodes constituted by thin films made of gold or silver function as the semi-reflective layer, Also in such a case, the optical distance between the semi-reflective layer and the reflective layer can be adjusted by appropriately setting the thicknesses of the transparent electrodes, or the thicknesses of both the transparent electrodes and the organic functional layers. That is, each of the red, blue, and green subpixels may also include a semi-reflective layer disposed at a level between the light-emitting layer and the color filter, In such a case, an auxiliary positive electrode made of ITO may also be included. Another possible configuration is that the pink subpixel is provided with a semi-reflective layer and a pink transparent electrode having two portions with different thicknesses.

Other Modifications

The first to fifth embodiments may also be modified as described below. The following modifications are also within the scope of the invention.

For example, if transparent electrodes and a passivation layer, made of a transparent material such as silicon nitride or silicon oxynitride, reside between the reflective layer and the semi-reflective layer, the optical distance between the reflective layer and the semi-reflective layer may also be adjusted by adjusting the thicknesses of both the transparent electrodes and the passivation layer.

Figure 19:
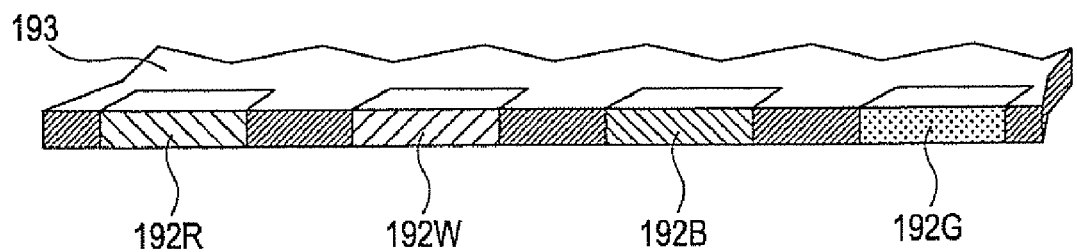
FIG. 19 shows an exemplary modification of the embodiments of the invention.
Figure 20:
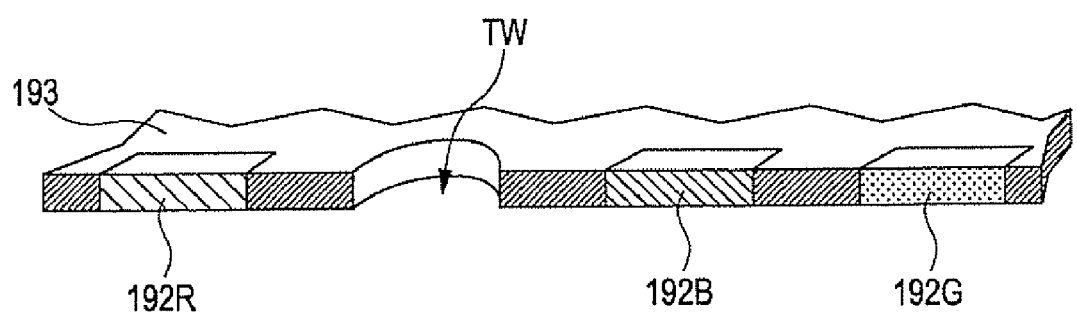
FIG. 20 shows another exemplary modification of the embodiments of the invention.

Other possible modifications are shown in FIGS. 19 and 20. FIG. 19 shows a modification including a color filter (transmissive layer) 192W that transmits white light instead of the color filter 192P. FIG. 20 shows a modification including a through window TW instead of the color filter 192P. These exemplary light-emitting devices include white subpixels displaying white instead of the pink subpixels, thereby displaying white by using only the white subpixels. Like the pink subpixel, the white subpixel is not a red, green, or blue subpixel, but a "remaining subpixel". The color filter 192W is made of a transmissive material that transmits visible light of all wavelengths. On the other hand, the through window TW encloses a layer of a transparent gas, such as air, thereby functioning as a color filter that transmits white light.

The invention can also be understood as another method for manufacturing a light-emitting device. The light-emitting device includes a plurality of pixels constituting a screen, each of the pixels including four subpixels, which are a red subpixel, a green subpixel, a blue subpixel, and a remaining subpixel. The red subpixel has a light-emitting layer made of a white-light-emitting material and extending along the screen, and a color filter provided above the light-emitting layer to transmit red light. The white-light-emitting material emits two-peak white light having an emission spectrum including a valley between a red peak residing in a wavelength range of red light and a blue peak residing in a wavelength range of blue light. The blue subpixel has a light-emitting layer made of the white-light-emitting material and extending along the screen, and a color filter provided above the light-emitting layer to transmit blue light. The remaining subpixel has a light-emitting layer made of the white-light-emitting material and extending along the screen. The green subpixel has a light-emitting layer made of a green-light-emitting material that emits green light and extending along the screen, and a color filter provided above the light-emitting layer to transmit green light. The light-emitting device also includes a planar element substrate. The light-emitting layer of each of the four subpixels is provided on the element substrate. The light-emitting layer of each of the red, green, and blue subpixels is disposed between the corresponding color filter and the element substrate. Each of the four subpixels has a transmissive layer that transmits light and is disposed between the corresponding light-emitting layer and the element substrate. The remaining subpixel has a reflective layer that reflects light and is disposed between the corresponding transmissive layer and the element substrate. The transmissive layer of the remaining subpixel includes two portions having different thicknesses, one of the portions having a thickness that intensifies light of a wavelength corresponding to the red peak because of interference, the other portion having a thickness that intensifies light of a wavelength corresponding to the blue peak because of interference. The method includes forming a subtransmissive layer that covers an area of the remaining subpixel parallel with the element substrate by using a transmissive material, and removing a part of the subtransmissive layer. The formation and the removal are repeated alternately.

With the light-emitting device manufactured by this method, sufficiently high display quality can be achieved with low power consumption. Further, this method allows incorporation of an etching process. Therefore, a fine structure that is difficult to form using a deposition mask can be formed. Specifically, the transmissive layer in the remaining subpixel can have two portions provided with different thicknesses. Accordingly, in the light-emitting device manufactured by this method, a reduction in the color purity of the remaining subpixel is suppressed, while the brightness in the remaining subpixel is increased. Thus, this manufacturing method realizes light-emitting devices manufactured in a sufficiently simple manner and having sufficiently high display quality with low power consumption.

Figure 21A:
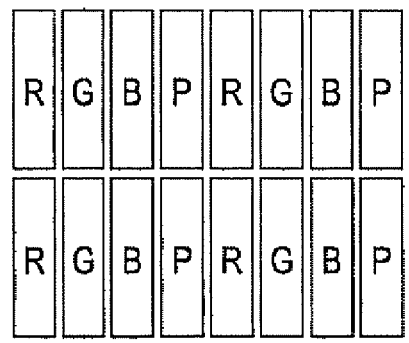
FIG. 21A shows yet another exemplary modification of the embodiments of the invention.
Figure 21B:
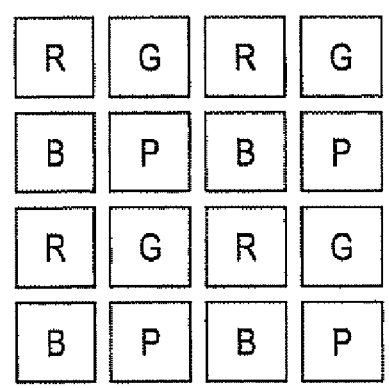
FIG. 21B shows yet another exemplary modification of the embodiments of the invention.
Figure 21C:
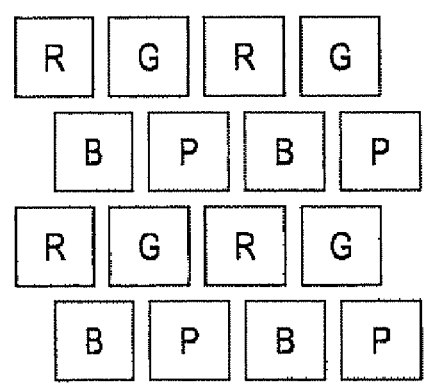
FIG. 21C shows yet another exemplary modification of the embodiments of the invention.

FIG. 21A shows a possible exemplary subpixel arrangement in which the subpixels are arranged in a stripe pattern, with any two of the remaining subpixel (pink subpixel), the red subpixel, and the blue subpixel sandwiching the other subpixel (the green subpixel). In FIG. 21A, the red subpixel and the blue subpixel have separate light-emitting layers. However, since the materials for those light-emitting layers are the same (a white-light-emitting material), the process for manufacturing the light-emitting device does not become complicated. FIG. 21B shows another possible exemplary subpixel arrangement in which the subpixels are arranged in a matrix. FIG. 21C shows another possible exemplary subpixel arrangement in which the matrix pattern in FIG. 21B is modified such that columns of the subpixels in odd-numbered rows do not match columns of the subpixels in even-numbered rows. Reference characters R, G, B, and P in FIGS. 21A to 21C denote a red subpixel, a green subpixel, a blue subpixel, and a pink subpixel, respectively.

Another possible modification is that one of the pair of electrodes, as organic EL elements, near the element substrate serves as a negative electrode and the other remote from the element substrate serves as a positive electrode.

Further, EL elements other than organic EL elements (i.e., inorganic EL elements), for example, may also be used as light-emitting elements.

Application

Figure 22:
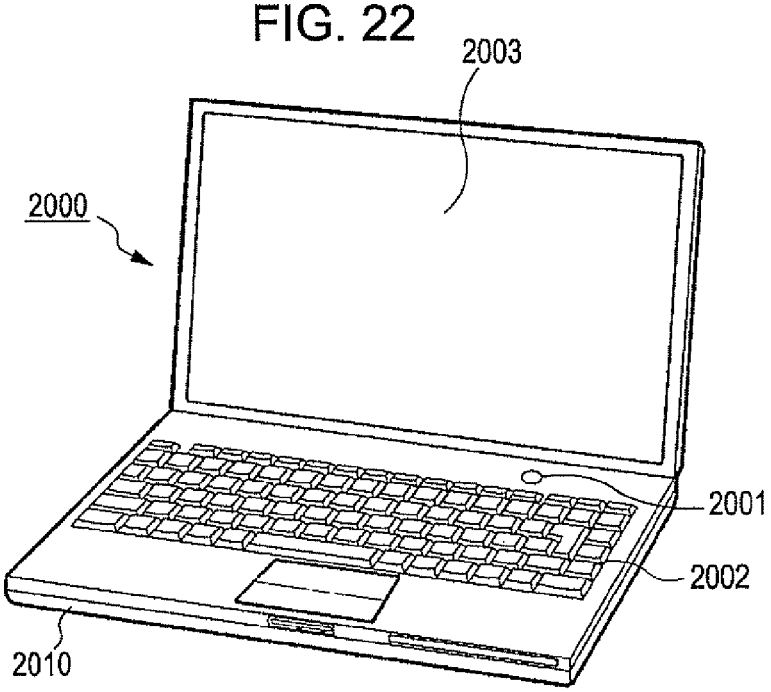
FIG. 22 shows a mobile personal computer including the light-emitting device 10 as a display device.
Figure 23:
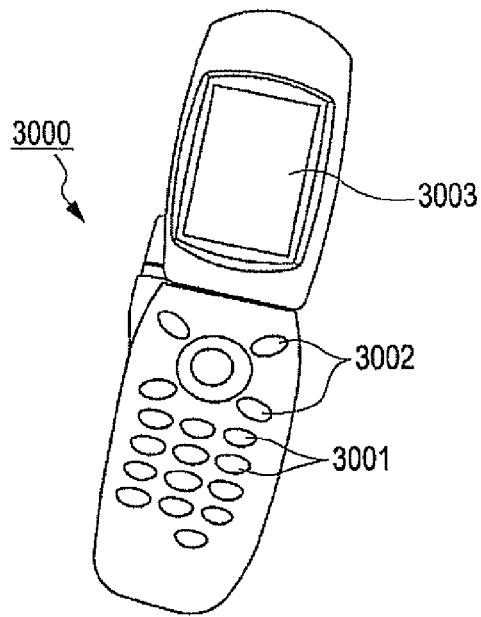
FIG. 23 shows a mobile phone including the light-emitting device 10 as a display device.
Figure 24:
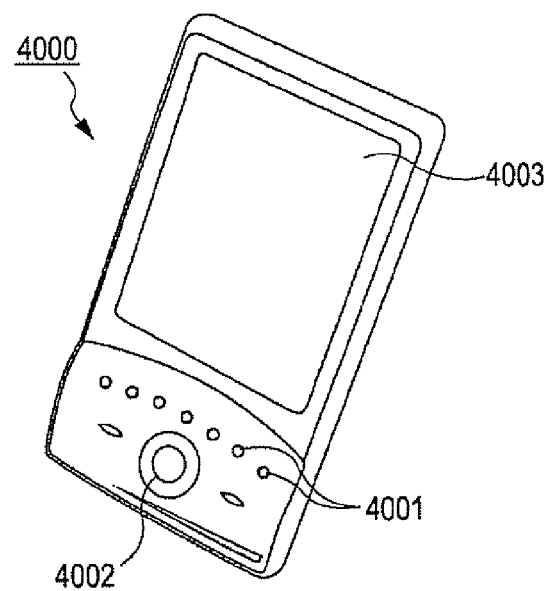
FIG. 24 shows a personal digital assistant including the light-emitting device 10 as a display device.

The light-emitting devices described above can be applied to various electronic apparatuses. FIGS. 22 to 24 show examples of electronic apparatuses including the light-emitting device 10 as a display device.

FIG. 22 shows a mobile personal computer including the light-emitting device 10 as a display device. A personal computer 2000 includes a display device 2003 (the light-emitting device 10) and a main body 2010. The main body 2010 includes a power switch 2001 and a keyboard 2002.

FIG. 23 shows a mobile phone including the light-emitting device 10 as a display device. A mobile phone 3000 includes a plurality of operation buttons 3001, a plurality of scroll buttons 3002, and a display device 3003 (the light-emitting device 10). Operation of the scroll buttons 3002 scrolls the screen displayed on the light-emitting device 10.

FIG. 24 shows a personal digital assistant (PDA) including the light-emitting device 10 as a display device. A PDA 4000 includes a plurality of operation buttons 4001, a power switch 4002, and a display device 4003 (the light-emitting device 10). Operation of the power switch 4002 displays various kinds of information, such as an address book and a schedule book, on the light-emitting device 10.

Examples of electronic apparatuses to which the light-emitting devices described above can be applied are not limited to those shown in FIGS. 22 to 24, but also include digital still cameras, televisions, video cameras, car navigation systems, pagers, electronic organizers, electronic papers, word processors, workstations, videophones, point-of-sale (POS) terminals, printers, copiers, video players, and apparatuses including touch panels.

What is claimed is:

1. A light-emitting device comprising:

a plurality of pixels constituting a screen, each of the pixels including four subpixels, which are a red subpixel, a green subpixel, a blue subpixel, and a remaining subpixel, wherein the red subpixel has a light-emitting layer made of a white-light-emitting material and extending along the screen, and a color filter provided above the light-emitting layer to transmit red light, the white-light-emitting material emitting two-peak white light having an emission spectrum including a valley between a red peak residing in a wavelength range of red light and a blue peak residing in a wavelength range of blue light, wherein the blue subpixel has a light-emitting layer made of the white-light-emitting material and extending along the screen, and a color filter provided above the light-emitting layer to transmit blue light, wherein the remaining subpixel has a light-emitting layer made of the white-light-emitting material and extending along the screen, and wherein the green subpixel has a light-emitting layer made of a green-light-emitting material that emits green light and extending along the screen, and a color filter provided above the light-emitting layer made of the green-light-emitting material to transmit green light.

2. The light-emitting device according to claim 1, wherein the remaining subpixel serves as a pink subpixel that has a color filter provided above the corresponding light-emitting layer to transmit pink light.

3. The light-emitting device according to claim 1, wherein the remaining subpixel serves as a white subpixel that displays a white color.

4. The light-emitting device according to claim 1, further comprising:
a planar element substrate; and
a light-absorbing layer that absorbs light and provided under the element substrate,
wherein the light-emitting layer of each of the four subpixels is provided on the element substrate, and
wherein the light-emitting layer of each of the red, green, and blue subpixels is disposed between the corresponding color filter and the element substrate.

5. The light-emitting device according to claim 1, further comprising:
a planar element substrate,
wherein the light-emitting layer of each of the four subpixels is provided on the element substrate and is disposed between the corresponding color filter and the element substrate,
wherein each of the four subpixels has a transmissive layer that transmits light and is disposed between the corresponding light-emitting layer and the element substrate, and a reflective layer that reflects light and is disposed between the transmissive layer and the element substrate,
wherein the transmissive layers of the red subpixel, the blue subpixel, and the remaining subpixel have a same thickness that intensifies light having a wavelength corresponding to the red peak and light having a wavelength corresponding to the blue peak simultaneously because of interference, and
wherein the transmissive layer of the green subpixel has a thickness that intensifies light having a wavelength corresponding to a peak of the green light emitted from the light-emitting layer in the green subpixel because of interference.

6. The light-emitting device according to claim 1, further comprising:
a planar element substrate,
wherein the light-emitting layer of each of the four subpixels is provided on the element substrate,
wherein the light-emitting layer of each of the red, green, and blue subpixels is disposed between the corresponding color filter and the element substrate,
wherein each of the four subpixels has a transmissive layer that transmits light and is disposed between the corresponding light-emitting layer and the element substrate, and
wherein each of the red, green, and blue subpixels has a reflective layer that reflects light and is disposed between the corresponding transmissive layer and the element substrate.

7. The light-emitting device according to claim 1, further comprising:
a planar element substrate,
wherein the light-emitting layer of each of the four subpixels is provided on the element substrate,
wherein the color filter of each of the red, green, and blue subpixels is disposed between the corresponding light-emitting layer and the element substrate, and
wherein each of the red, green, and blue subpixels has a semi-reflective layer, which is transmissive and reflective, disposed between the corresponding light-emitting layer and the corresponding color filter.

8. The light-emitting device according to claim 1, wherein the remaining subpixel, the red subpixel, and the blue subpixel are arranged such that another subpixel is not disposed therebetween and have a common light-emitting layer.

9. An electronic apparatus comprising the light-emitting device according to claim 1.

10. A method for manufacturing a light-emitting device including a plurality of pixels constituting a screen, each of the pixels including four subpixels, which are a red subpixel, a green subpixel, a blue subpixel, and a remaining subpixel, wherein the red subpixel has a light-emitting layer made of a white-light-emitting material and extending along the screen, and a color filter provided above the light-emitting layer to transmit red light, the white-light-emitting material emitting two-peak white light having an emission spectrum including a valley between a red peak residing in a wavelength range of red light and a blue peak residing in a wavelength range of blue light; wherein the blue subpixel has a light-emitting layer made of the white-light-emitting material and extending along the screen, and a color filter provided above the light-emitting layer to transmit blue light; wherein the remaining subpixel has a light-emitting layer made of the white-light-emitting material and extending along the screen; wherein the green subpixel has a light-emitting layer made of a green-light-emitting material that emits green light and extending along the screen, and a color filter provided above the light-emitting layer to transmit green light; and wherein the remaining subpixel, the red subpixel, and the blue subpixel are arranged such that another subpixel is not disposed therebetween, the method comprising:
integrally forming the light-emitting layers of the red subpixel, the blue subpixel, and the remaining subpixel with the white-light-emitting material on an element substrate extending along the screen.

11. A light-emitting device comprising:
a plurality of pixels constituting a screen, each of the plurality of pixels having four sub-pixels constituting the screen, and
the four sub-pixels being a red sub-pixel, a green sub-pixel, a blue sub-pixel, and a pink sub-pixel,
wherein:
the red subpixel has a light-emitting layer made of a white-light-emitting material and extending along the screen, the white-light-emitting material emitting two-peak white light having an emission spectrum including a valley between a red peak residing in a wavelength range of red light and a blue peak residing in a wavelength range of blue light; a reflective layer that sandwiches the first light-emitting layer and reflects light; a translucent layer, which transmits and reflects light; and a color filter provide above the first light-emitting layer to transmit red light,
the first light-emitting layer, the reflective layer and the translucent layer are continuously arranged over the red sub-pixel, the blue sub-pixel, and the pink sub-pixel,
the blue sub-pixel has the first light-emitting layer, the reflective layer and the translucent layer, which sandwich the first light-emitting layer, and a color filter provided above the first light-emitting layer to transmit blue color,
the pink sub-pixel has the first light-emitting layer, the reflective layer and the translucent layer, which sandwich the first light-emitting layer, and a color filter provided above the first light-emitting layer to transmit pink light, the green sub-pixel has a second light-emitting layer made of a green light-emitting material that emits green light and extends along the screen, and a color filter provided above the second light-emitting layer to transmit green light, the red sub-pixel, the blue sub-pixel, and the pink sub-pixel have a first transmissive layer with light transmissivity between those of the first light-emitting layer and the reflective layer, the first transmissive layer has a common thickness, which is determined such that light of a wavelength of the red peak and the blue peak can be strengthened by interference generated between the reflective layer and the translucent layer, the second light-emitting layer is arranged within the green sub-pixel so as to be separated from the first light-emitting layer, and a partition wall is arranged between the first and second light-emitting layers.

* * * * *